(12) United States Patent
Torwesten et al.

(10) Patent No.: US 9,245,868 B2
(45) Date of Patent: Jan. 26, 2016

(54) METHOD FOR MANUFACTURING A CHIP PACKAGE

(75) Inventors: Holger Torwesten, Regensburg (DE); Manfred Mengel, Bad Abbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 346 days.

(21) Appl. No.: 13/534,144

(22) Filed: Jun. 27, 2012

(65) Prior Publication Data

US 2014/0001634 A1 Jan. 2, 2014

(51) Int. Cl.
*H01L 21/00* (2006.01)
*H01L 23/00* (2006.01)
(Continued)

(52) U.S. Cl.
CPC .............. *H01L 24/83* (2013.01); *H01L 23/293* (2013.01); *H01L 23/3121* (2013.01); *H01L 23/49513* (2013.01); *H01L 23/49582* (2013.01); *H01L 24/29* (2013.01); *H01L 24/92* (2013.01); H01L 21/561 (2013.01); H01L 24/05 (2013.01); H01L 24/06 (2013.01); H01L 24/32 (2013.01); H01L 24/73 (2013.01); H01L 2224/0346 (2013.01); *H01L 2224/0401* (2013.01); *H01L 2224/04026* (2013.01); *H01L 2224/04042* (2013.01); *H01L 2224/04105* (2013.01); *H01L 2224/0566* (2013.01); *H01L 2224/05568* (2013.01); *H01L 2224/05582* (2013.01); *H01L 2224/05611* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05672* (2013.01); *H01L 2224/06181* (2013.01); *H01L 2224/12105* (2013.01); *H01L 2224/131* (2013.01); *H01L 2224/2731* (2013.01); *H01L 2224/27332* (2013.01); *H01L 2224/27334* (2013.01); *H01L 2224/2912* (2013.01); *H01L 2224/2919* (2013.01); *H01L 2224/2929* (2013.01); *H01L 2224/29082* (2013.01); *H01L 2224/29105* (2013.01); *H01L 2224/29109* (2013.01); *H01L 2224/29111* (2013.01); *H01L 2224/29113* (2013.01); *H01L 2224/29116* (2013.01); *H01L 2224/29118* (2013.01); *H01L 2224/29139* (2013.01); *H01L 2224/29144* (2013.01); *H01L 2224/29155* (2013.01); *H01L 2224/29294* (2013.01); (Continued)

(58) Field of Classification Search
USPC ................... 257/E23.031, E23.036, E23.037, 257/E23.054, E21.506, E23.141; 438/118, 438/115, 628, FOR. 485, FOR. 369, 438/FOR. 370
See application file for complete search history.

(56) References Cited

U.S. PATENT DOCUMENTS 6,107,679 A * 8/2000 Noguchi ........................ 257/678
6,198,165 B1 * 3/2001 Yamaji et al. .................. 257/734

(Continued)

FOREIGN PATENT DOCUMENTS

CN 1348208 A 5/2002
CN 1790648 A 6/2006

*Primary Examiner* — Jasmine Clark

(57) ABSTRACT

A method for manufacturing a chip package is provided, the method including: forming a layer arrangement over a carrier; arranging a chip including one or more contact pads over the layer arrangement wherein the chip covers at least part of the layer arrangement; and selectively removing one or more portions of the layer arrangement and using the chip as a mask such that at least part of the layer arrangement covered by the chip is not removed.

25 Claims, 9 Drawing Sheets

(51) Int. Cl.
*H01L 23/29* (2006.01)
*H01L 23/495* (2006.01)
*H01L 23/31* (2006.01)
*H01L 21/56* (2006.01)

(52) U.S. Cl.
CPC ........... *H01L 2224/29339* (2013.01); *H01L 2224/29344* (2013.01); *H01L 2224/29347* (2013.01); *H01L 2224/32245* (2013.01); *H01L 2224/48245* (2013.01); *H01L 2224/48247* (2013.01); *H01L 2224/73253* (2013.01); *H01L 2224/73265* (2013.01); *H01L 2224/83192* (2013.01); *H01L 2224/83439* (2013.01); *H01L 2224/83447* (2013.01); *H01L 2224/83825* (2013.01); *H01L 2224/83855* (2013.01); *H01L 2224/92* (2013.01); *H01L 2224/9202* (2013.01); *H01L 2224/92143* (2013.01); *H01L 2224/92147* (2013.01); *H01L 2224/94* (2013.01); *H01L 2224/95* (2013.01); *H01L 2924/00014* (2013.01); *H01L 2924/07802* (2013.01); *H01L 2924/1305* (2013.01); *H01L 2924/13055* (2013.01); *H01L 2924/15747* (2013.01); *H01L 2924/181* (2013.01)

(56) References Cited

U.S. PATENT DOCUMENTS

| | | | |
|---|---|---|---|
| 6,638,865 | B2 | 10/2003 | Tanaka |
| 7,442,579 | B2 | 10/2008 | Chen et al. |
| 2002/0042189 | A1 | 4/2002 | Tanaka |
| 2006/0110852 | A1 | 5/2006 | Chen et al. |
| 2006/0113683 | A1* | 6/2006 | Dean et al. ............ 257/783 |
| 2013/0065364 | A1* | 3/2013 | Kuroda et al. ........ 438/118 |

* cited by examiner

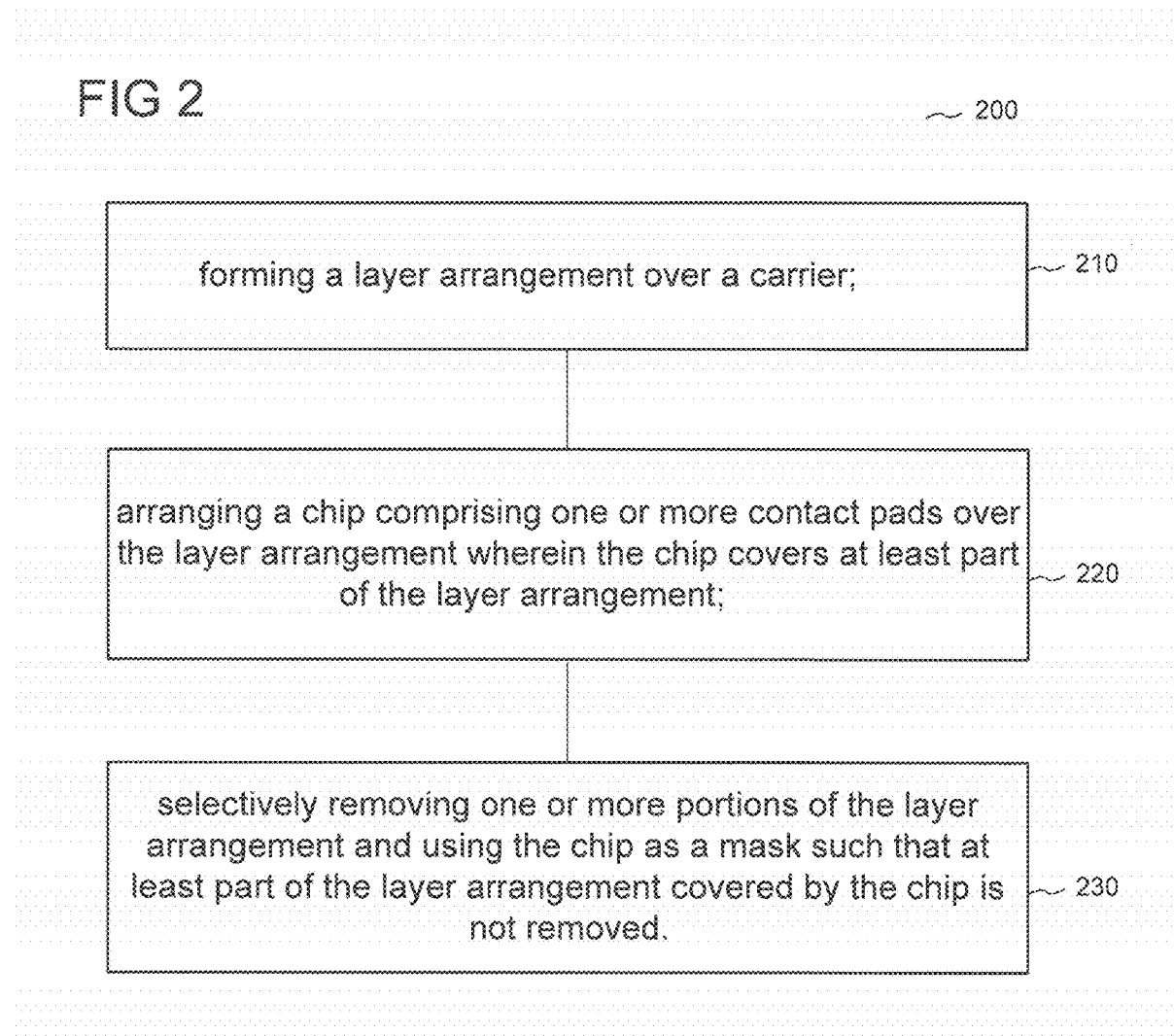

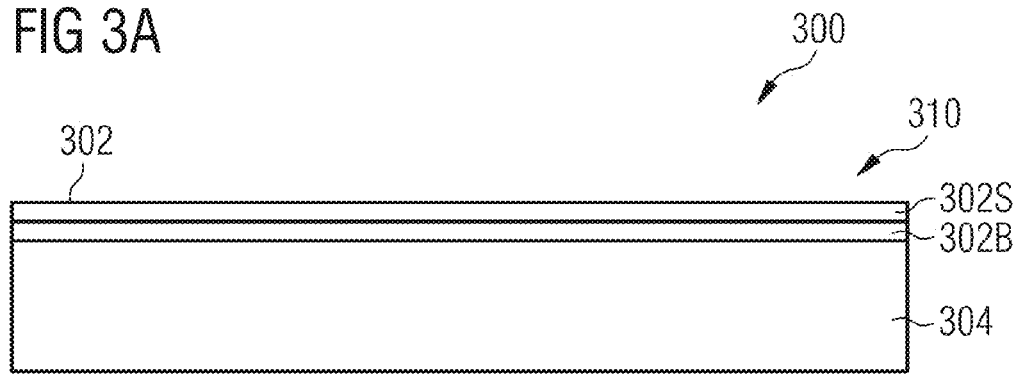
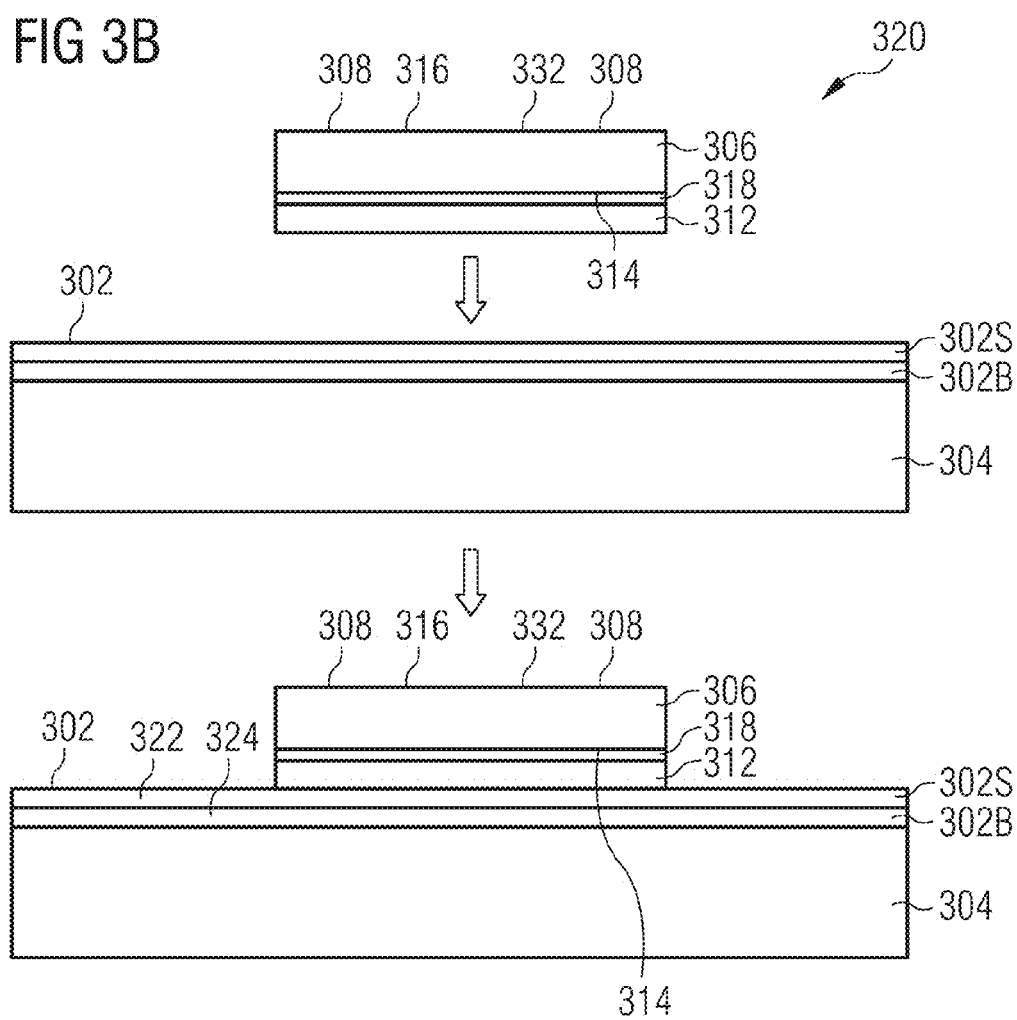

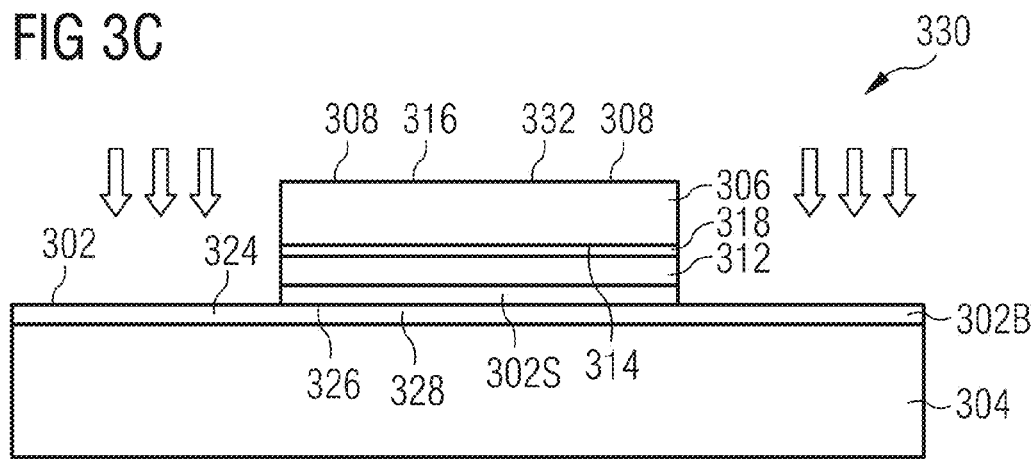
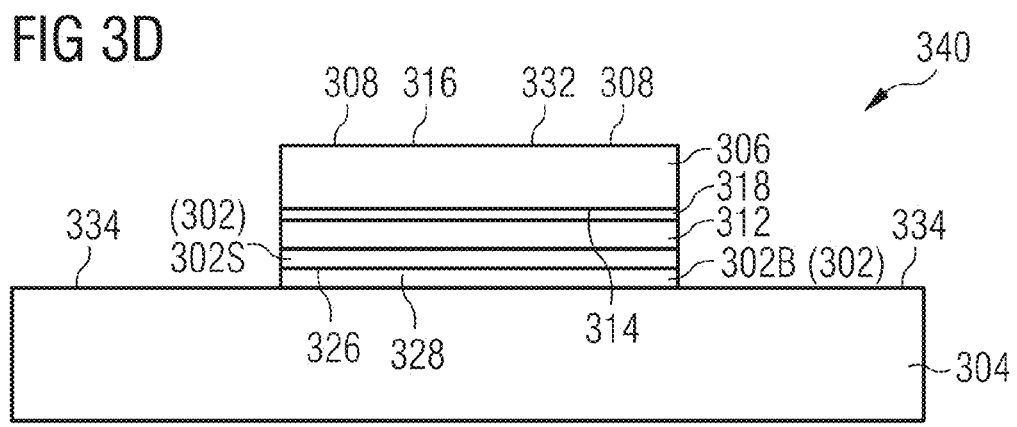

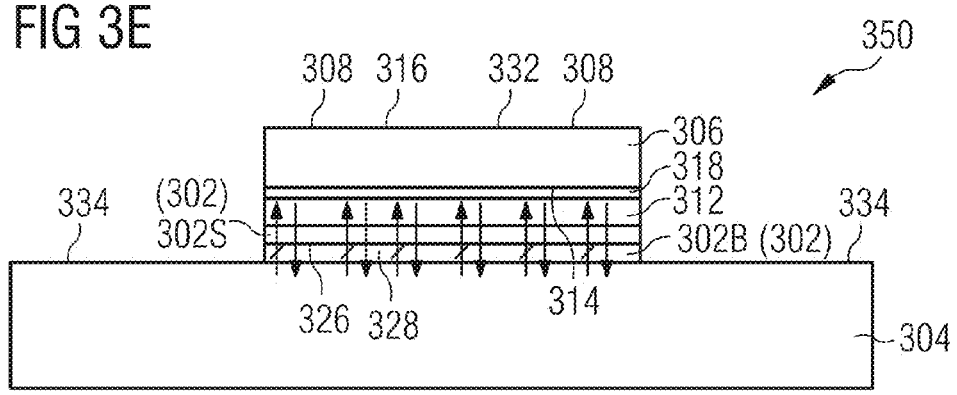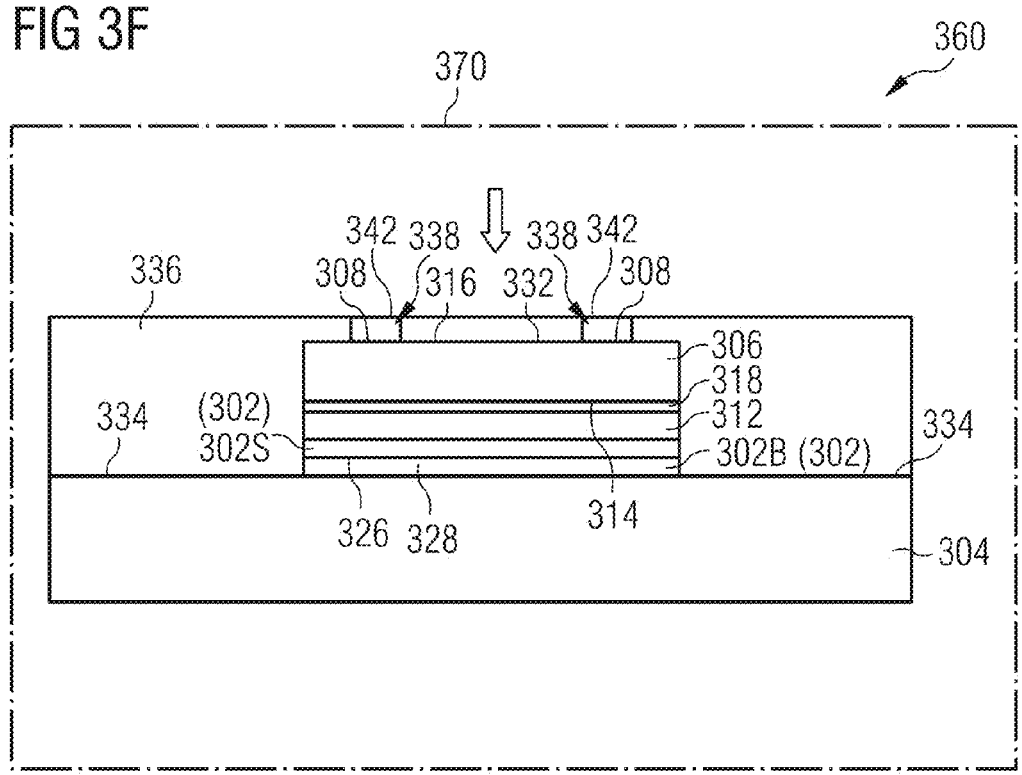

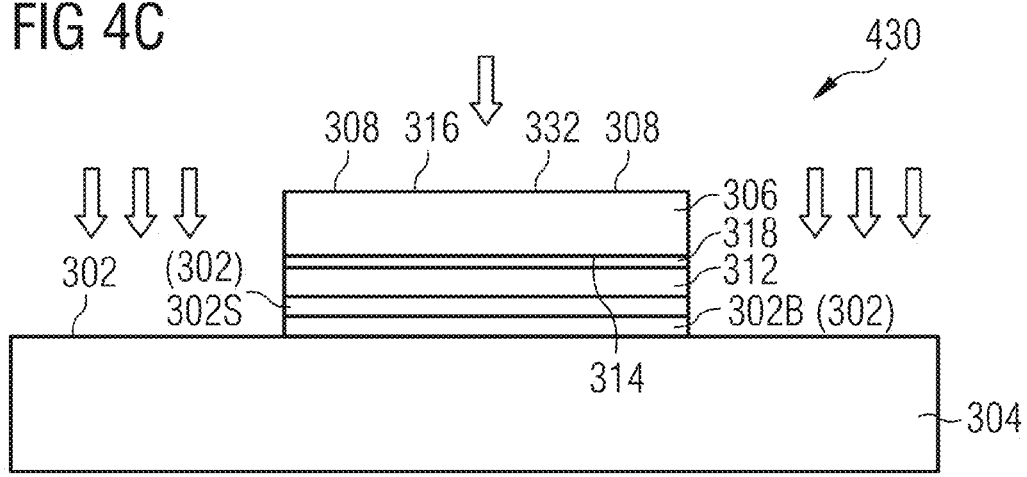

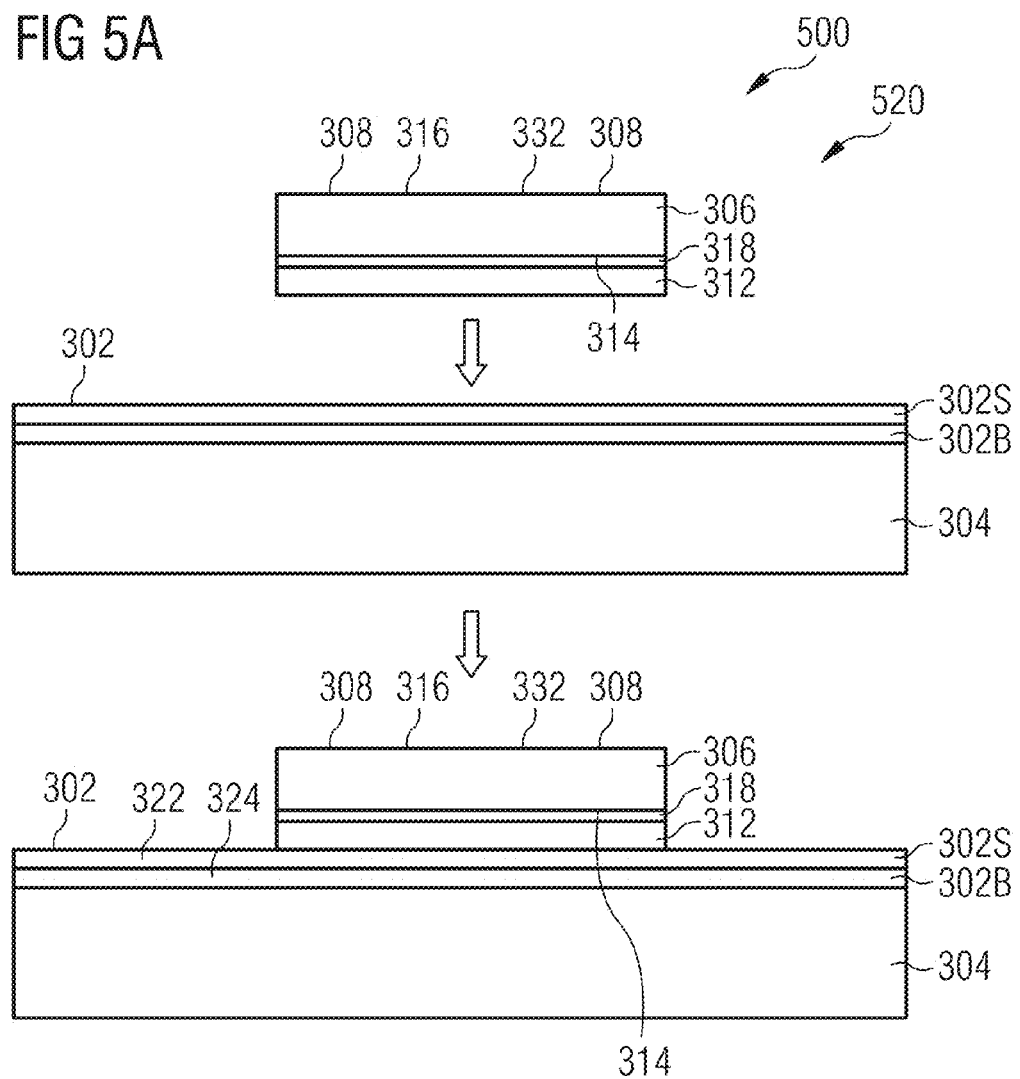

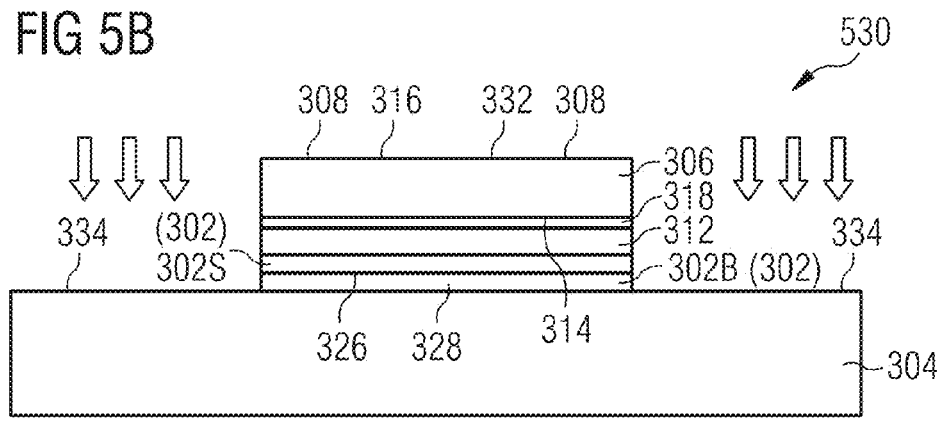
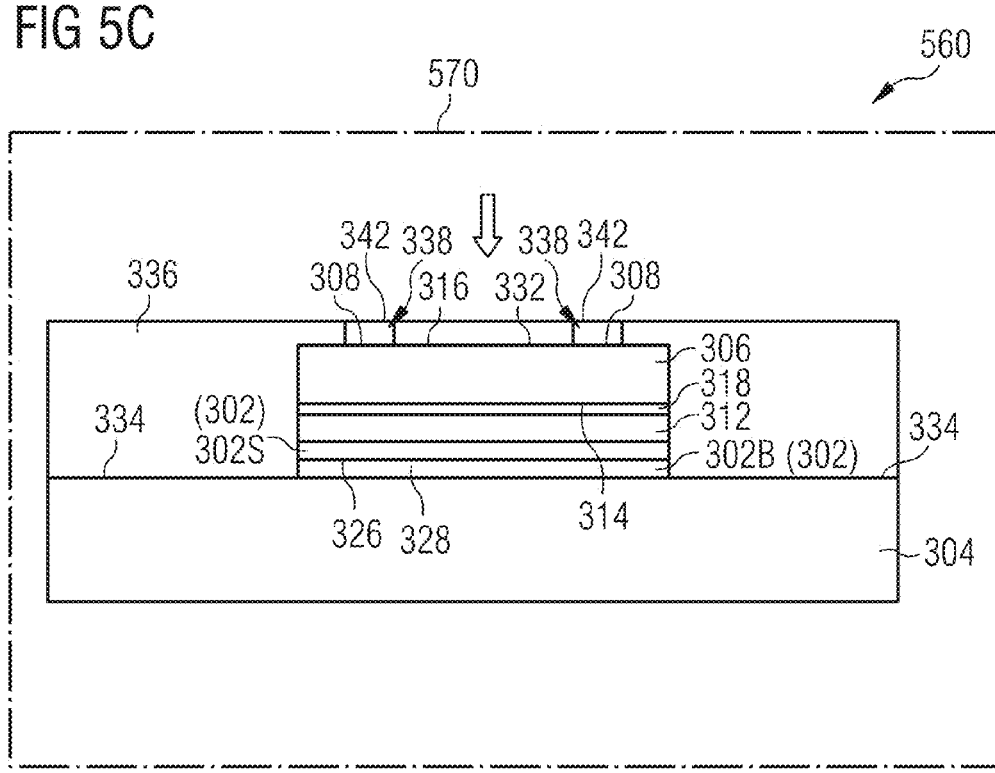

METHOD FOR MANUFACTURING A CHIP PACKAGE

TECHNICAL FIELD

Various embodiments relate generally to a chip package and methods for manufacturing a chip package.

BACKGROUND

Several challenges are associated with component assembly in semiconductor modules. Such semiconductor modules may include semiconductor chip packages with one or more chips arranged over a leadframe substrate.

With such semiconductor modules, it may be necessary that a leadframe be structured with appropriate contact surfaces onto which chips may be arranged or contacted, in order to be in electrical contact with the leadframe. The chip contact areas may be in each case formed from different types of materials in comparison to the normal leadframe surfaces to optimize a chip adhesion process and to ensure an optimal adhesion of the leadframe to the polymer encapsulation. The production of a structured leadframe is associated with clearly high costs, as a lithographic process may be necessary, and a hard mask must be produced. Furthermore, for every new component design, for different chips with different positions and sizes, a hard mask for the lithography process must be manufactured, which is costly and time intensive. Furthermore, there is a high risk of chip errors with different chip types, and logistic costs for redesigns. Therefore, structured leadframes are normally associated with a costly manufacture and delivery.

Furthermore, through the use of structure leadframes for chip assembly, the respective surfaces of the chips must be brought onto the exact respective surfaces of the leadframe, in other words, the exact positions must be known. Furthermore, the edges/sides of the existing substrate surfaces are a weak point in reliability tests as they have a weaker adhesion in comparison to the rest of the leadframe, which may possibly be roughened. This poses a reliability risk for the components and there is currently no means to overcome these challenges.

With respect to the chip assembly process, i.e. during the component assembly, contaminants, e.g. organic materials, may exist near the chip side and/or on the substrate leadframe top surfaces, and unless additional cleaning is carried out, may hinder further processes such as substrate roughening, or may cause the reliability of connecting the leadframe to encapsulation material to deteriorate. As a result, complicated cleaning processes with damage and contaminations risks may have to be carried out for the removal of contaminants.

With respect to other aspects of component assembly, such as for example during the sawing process, the chip backside bather may be attacked or partially destroyed thereby causing copper from the leadframe to diffuse through the porous chip backside barrier, and electrical drifts and/or precipitation/leakages, may cause a huge reliability problem. Up till now, there has been no means to overcome these challenges related to increased failure rate of the assembly and reliability risks of the components.

SUMMARY

Various embodiments provide a method for manufacturing a chip package, the method including: forming a layer arrangement over a carrier; arranging a chip including one or more contact pads over the layer arrangement wherein the chip covers at least part of the layer arrangement; and selectively removing one or more portions of the layer arrangement and using the chip as a mask such that at least part of the layer arrangement covered by the chip is not removed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a method for manufacturing a chip package according to an embodiment;

FIGS. 3A to 3F show a method for manufacturing a chip package according to an embodiment;

FIGS. 4A to 4C show a method for manufacturing a chip package according to an embodiment;

FIGS. 5A to 5C show a method for manufacturing a chip package according to an embodiment.

DETAILED DESCRIPTION

Figure 1A:
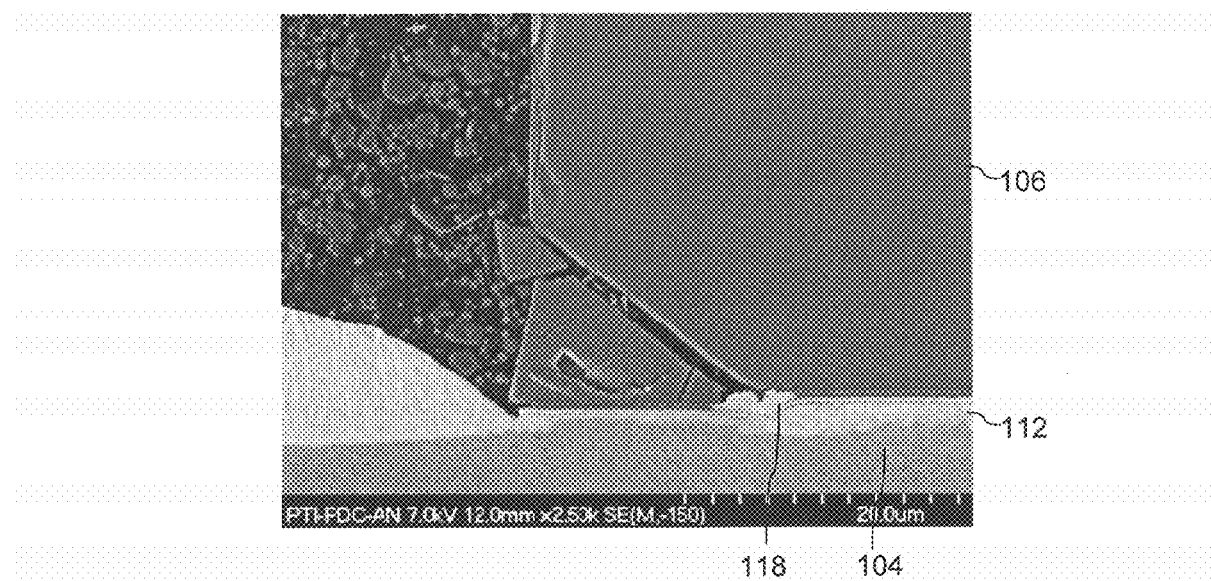
FIGS. 1A and 1B show a method for manufacturing a chip package according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide a method for manufacturing a chip package, wherein a leadframe or a substrate panel may be partially and/or fully covered with thin metal layers, e.g. one layer, or two layers or more. On an upper layer, a good, reliable, chip connection in subsequent chip assembly processes may be achieved. An upper layer material may be, e.g. a sputtered Ag layer or Cu layer. A lower layer e.g. may be a Ti or TiW layer, with bather properties, such as diffusion barrier layer component normally used as chip backside metallization.

Various embodiments provide a method for manufacturing a chip package, wherein the thin metallization layer or layers, may subsequently be removed in a selective etch process after the chip assembly and may remain only outside the chip area. Known etch processes, e.g. wet chemical etch processes, may be used, which do not damage the active chip top surface.

Various embodiments provide a method for structuring a substrate carrier with the help of bonded chips as a hard mask and through the deposition of one or more functional layers, site-selectively, below the chip bonding material. Depending on the required application, the one or more functional layers may serve as an adhesion medium and/or diffusions barrier and/or isolations layer between chip bonding material and substrate carrier material. Following which, the wiring of the chips and encapsulation processes may be carried out.

Various embodiments provide a method for manufacturing a chip package, which provides time and cost savings from the use of conventional already pre-structured carrier substrates, which may be expensive. The method may avoid a separate lithography process and manufacturing additional hard masks for forming the pre-structured carrier substrates.

Various embodiments provide a method for manufacturing a chip package, which may provides a fast redesign with different types of chips sizes and positions, thereby providing saving in terms of logistics and mask preparation.

Various embodiments provide a method for manufacturing a chip package, wherein there may be no need for specially plated regions of carrier material between the chips, which may be the case for pre-plated leadframes to give tolerance space by larger chip pads for the chip placements. For ordinary pre-plated leadframes the smooth tolerance chip pad surface area next to the chips will have less adhesion strength to the encapsulate compared to the carrier surface interaction to the encapsulate. Instead here, the areas of the carrier under the chips are defined by the chips themselves functioning as a hard mask and without the need of chip pads, the area in between the chips may be completely used as an adhesion medium from substrate carrier to encapsulation material. The herein described system is self-aligning and additional reserved area beside the chip on the leadframe may not be needed.

Figure 1B:
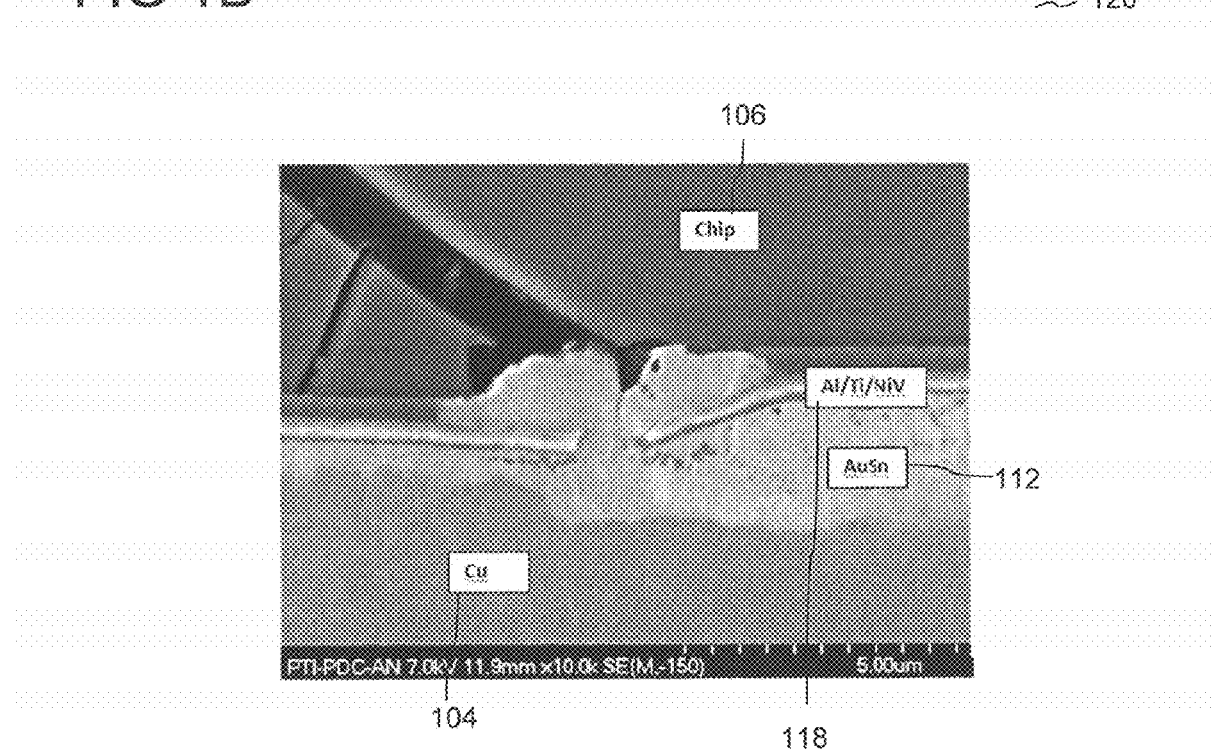

Chip packages, especially damaged chips, may be prone to problems associated with unwanted diffusion, such as diffusion from copper leadframe into die attach materials and/or from copper leadframes into the chip and/or from die attach into chip. These are shown in FIGS. 1A and 1B which will be further explained in the text. As shown in FIGS. 1A and 1B, a backside metallization layer 118 may typically be formed over chip surface, e.g. typically chip bottom side (the side of chip 106 to be adhered to the carrier 104). Die attach materials 112 may be formed over the backside metallization layer 118, and the die attach material 112 may adhere the chip 106 to carrier 104. Various embodiments provide a method for manufacturing a chip package, which increases reliability of chip assembly through the building of an addition diffusion bather, e.g. copper, on the carrier below the chip bonding material, e.g. not only on the chip adhered side, but also on the other side of the die attach material, i.e. between the die attach material and the carrier.

Various embodiments provide a method for manufacturing a chip package, which may provide an inexpensive and effective cleaning of "die attach bleed outs", e.g. contamination from the chip assembly process.

FIG. 2 shows method 200 for manufacturing a chip package according to an embodiment. Method 200 may include forming a layer arrangement over a carrier (in 210);

arranging a chip including one or more contact pads over the layer arrangement wherein the chip covers at least part of the layer arrangement (in 220); and Selectively removing one or more portions of the layer arrangement and using the chip as a mask such that at least part of the layer arrangement covered by the chip is not removed (in 230).

FIGS. 3A to 3F show method 300 for manufacturing a chip package according to an embodiment.

Method 300 may include forming layer arrangement 302 over carrier 304 as shown in process 310 of FIG. 3A.

Forming layer arrangement 302 over carrier 304 may include forming layer arrangement 302 over carrier 304, carrier 304 including an electrically conductive leadframe. Carrier 304, which may include a leadframe or substrate panel, may include at least one material from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

Layer arrangement 302 may include bather layer 302B and sacrificial layer 302S. Forming layer arrangement 302 over carrier 304 may include depositing bather layer 302B over carrier 304; and depositing sacrificial layer 302S over barrier layer 302B. For example, forming layer arrangement 302 over carrier 304 may include depositing bather layer 302B directly on carrier 304; and subsequently or simultaneously depositing sacrificial layer 302S directly on bather layer 302B. Layer arrangement 302 may substantially cover carrier 304, e.g. substantially fully cover carrier 304.

Bather layer 302B may be deposited by at least one method from the following group of methods, the group consisting of: chemical vapor deposition. Bather layer 302B may include at least one material from the following group of materials, the group of materials consisting of: Ti, TiW, silicon nitride, silicon oxide, silicon dioxide. Bather layer 302B may have an approximate thickness of about 50 nm. According to various embodiments, bather layer 302B may include a thickness ranging from about 30 nm to about 300 nm, e.g. about 50 nm to about 200 nm, e.g. about 50 nm to about 100 nm.

Sacrificial layer 302S may be deposited by at least one method from the following group of methods, the group consisting of: sputtering, evaporation, printing. For example, evaporation of metals or metal-compound or printing of metal-complexes may be carried out for the deposition of sacrificial layer 302S. Sacrificial layer 302S may include at least one material from the following group of materials, the group of materials consisting of: Cu, Ag. Sacrificial layer 302S may have an approximate thickness of about 200 nm. Sacrificial layer 302S may include a thickness ranging from about 50 nm to about 400 nm, e.g. about 100 nm to about 300 nm, e.g. about 175 nm to about 225 nm.

Method 300, as shown in FIG. 3B, process 320, and analogous processes 420 (FIG. 4B) and 520 (FIG. 5A), may include subsequently arranging chip 306 including one or more contact pads 308, 318 over layer arrangement 302 wherein chip 306 may cover at least part of the layer arrangement 302. First chip side 314 of chip 306 may be arranged directly on (in other words in physical contact with) layer arrangement 302. Arranging chip 306 including one or more contact pads 308, 318 over layer arrangement 302 may include adhering chip 306 to layer arrangement 302 via adhesion material 312 formed over first chip side 314. For example, chip 306 may be adhered, e.g. glued, e.g. fixed, to sacrificial layer 302S, e.g. in direct physical and/or direct electrical connection with sacrificial layer 302S.

Chip 306, e.g. a semiconductor die, may include one or more electronic components formed over a wafer substrate. The wafer substrate may include various materials, e.g. semiconductor materials. The wafer substrate may include at least one from the following group of materials, the group of materials consisting of: Silicon, Germanium, Group III to V materials, polymers. According to an embodiment, the wafer substrate may include doped or undoped silicon. According to another embodiment, the wafer substrate may include a silicon on insulator SOI wafer. According to an embodiment, the wafer substrate may include a semiconductor compound material, e.g. gallium arsenide (GaAs), indium phosphide (InP). According to an embodiment, the wafer substrate may include a quaternary semiconductor compound material, e.g. indium gallium arsenide (InGaAs).

Chip 306 may include first chip side 314 and second chip side 316. Second chip side 316 may include a chip top side, which may also be referred to as a "second side", "front side" or "upper side" of the chip. The terms "top side", "second side", "front side" or "upper side" may be used interchangeably hereinafter. First chip side 314 may include a chip bottom side, which may also be referred to as "first side" or "back side" of the chip. The terms "first side", "back side", or "bottom side" may be used interchangeably hereinafter. It may be understood, that generally, one or more contact pads 308 may be formed over second chip side 316, e.g. directly on a chip surface on first chip side.

One or more contact pads 308, 318, e.g. backside metallization layer 318, may include at least one material, element or alloy from the following group of materials, the group consisting of: copper, aluminum, silver, tin, gold, palladium, zinc, nickel, iron, titanium, vanadium. One or more contact pads 308, 318 may include one or more noble metals. It may be understood that one or more contact pads 308, 318 may generally be manufactured, e.g. formed, e.g. processed, during wafer processing, i.e. during front-end process.

Backside metallization layer 318, may be formed over, e.g. directly on, first chip side 314. Adhesion material 312, also referred to as a die attach material, may be formed over first chip side 314, e.g. over backside metallization layer 318. For example, adhesion material 312 may be formed directly on backside metallization layer 318.

Adhesion material 312 may include at least one material from the following group of materials, the group of materials consisting of: a solder, an adhesive glue, a resin, an adhesive polymer, a paste, and adhesive paste, an epoxy filled or unfilled with nanoparticles, adhesive tape, e.g. double-sided tape, or foil. Depending on the requirements, e.g. whether or not an electrical connection may be required between first chip side 314 and carrier 304, adhesion material 312 may be either electrically conducting or electrically insulating, and the layers 302B, 302S in layer arrangement 302 may also be either electrically conducting or electrically insulating.

According to various embodiments, chip 306 may include a semiconductor power device or a semiconductor logic chip. Semiconductor power devices refer generally to power devices carrying voltages larger than 150 V, e.g. up to 1000 V or more. Semiconductor logic chips refer generally to low power semiconductor device, e.g. devices capable of carrying up to 100 V to 150 V.

With respect to semiconductor power devices, second chip side 316, e.g. the terms "top side", "first side", "front side" or "upper side", may be understood to refer to the side of the chip wherein one or more contact pads 308, e.g. a gate region and at least one first source/drain region may be formed. Furthermore, first chip side 314, e.g. the terms "second side", "back side", or "bottom side" may be understood to refer to the side of the chip wherein a further contact pad 318, e.g. second source/drain region, may be formed, and vertical current flow may be supported through the chip, between first chip side 314 and second chip side 316. Generally, if chip 306 includes a semiconductor power device, then an electrical connection may be required between first chip side 314 and carrier 304. Therefore, further contact pad 318, adhesion material 312 and layer arrangement 302, e.g. including barrier layer 302B and sacrificial layer 302S may be selected such that an electrical path may be provided between first chip side 314 and carrier 304.

With respect to semiconductor logic chips, e.g. application specific integrated chip ASIC, drivers, controllers, sensors, second chip side 316, may be understood to refer to the side of the chip which carries one or more contact pads 308, or electrical contacts, wherein bonding pads or electrical connects may be attached; or wherein it is the side of chip 306 which may be mostly covered by metallization layers. Second chip side 316 may be understood to refer to the side of the chip which may be free from metallization or contact pads or electrical contacts. Backside metallization layer 318 may not be required, and therefore omitted. Generally, if chip 306 includes a semiconductor logic device, then an electrical connection may not be required between first chip side 314 and carrier 304 and electrical insulation may be required instead. Therefore adhesion material 312 and layer arrangement 302, e.g. including barrier layer 302B and sacrificial layer 302S, may be selected such that first chip side 314 and carrier 304 may be electrically insulated from each other.

It may be understood that materials selection may be well considered, for example, in view of the requirements of the device, and further in view of subsequent selective removal processes. Various other embodiments related to materials selection are shown in FIGS. 3A to 3F and later figures FIGS. 4B, 4C, 5A, 5B, 5C).

It may be understood that method 300 may also be extended to a method for manufacturing a wafer level package. For example, the number of chips 306 arranged over carrier 304, may not be limited to one, but may include a plurality of chips, e.g. one, two, three, etc, or tens, hundreds or thousands of chips.

Method 300, as shown in FIG. 3C, processes 330 to 350, and analogous processes 430 (FIG. 4C) and 530 (FIG. 5B), may include subsequently selectively removing one or more portions of layer arrangement 302 and using chip 306 as a mask such that at least part of layer arrangement 302 covered by chip 306 may not be removed. This may include selectively removing with an etchant one or more portions 322, 324 (See FIG. 3B), of layer arrangement 302 not covered by chip 306, and using chip 306 as a hard mask which is resistant to removal by the etchant. In a multiple-step, e.g. two-step, etching process, one or more portions 322 of sacrificial layer 302S not covered by chip 306 may be selectively removed (in 330) and subsequently one or more portions 324 of bather layer 302B not covered by chip 306 may be selectively removed (in 340). Selectively removing may be used herein to mean selectively etched, by wet chemical etching or by dry etching e.g. by plasma etching, e.g. reactive ion etching. In other words, the method may include selectively removing with an etchant, e.g. a chemical etchant, one or more portions 322 of sacrificial layer 302S not covered by chip 306, wherein bather layer 302B, including one or more portions 324 of barrier layer 302B, may be resistant to removal by the etchant. In other words, bather layer 302B, including one or more portions 324 of bather layer 302B, may be an etch stop layer for the selective removal of sacrificial layer 302S (in 330). Subsequently a further etchant, which may be different to the etchant for etching sacrificial layer 302S, may be used to remove one or more portions 324 of bather layer 302B not covered by chip 306. Therefore, in process 330, sacrificial layer 302S may be over-etched as bather layer 302B may be resistant to the etching of sacrificial layer 302S, e.g. to the etchant used for the etching of sacrificial layer 302S.

Etching of barrier layer 302B by the further etchant may remove one or more portions 324 of barrier layer 302B not protected by the chip hard mask 306. The selective removal of one or more portions 322, 324 of layer arrangement 302, uses chip 306 as a mask, e.g. a hard mask. Therefore, at least part 326, 328 of layer arrangement 302 covered by chip 306 may not be removed. In other words, at least part 326 of sacrificial layer 302S and at least part 328 of barrier layer 302B covered by chip 306 may not be removed. Parts 326 and 328 may be formed over carrier 304. It may be possible that part 326 of sacrificial layer 302S and part 328 of bather layer 302B may be undercut from the sidewalls of chip 306, for example, the surface area of parts 326, 328 may be equal to or smaller than the surface area of first chip side 314 due to the use of chip 306 as a hard mask.

According to an embodiment, an etchant for etching sacrificial layer 302S may include hydrofluoric acid (HF) e.g. buffered HF, e.g. diluted HF. For example, buffered HF may be used to etch sacrificial layer 302S if sacrificial layer 302S includes a silver layer.

According to an embodiment, an etchant for etching bather layer 302B may include a mixture of ammonia ($NH_3$), hydrogen peroxide ($H_2O_2$) and Water ($H_2O$), which may be used to etch bather layer 302B if barrier layer 302B includes a Ti layer or a TiW layer.

According to an embodiment, a wet etchant for etching layer arrangement 302, e.g. bather layer 302B, may include e.g. dilute HF solution (40 to 48%), According to an embodiment, a dry etchant for etching layer arrangement 302, e.g. barrier layer 302B may include e.g. CF4 plasma (with or without argon (Ar) and/or oxygen (O2)), if bather layer 302B includes silicon dioxide ($SiO_2$).

According to an embodiment, a wet etchant for etching layer arrangement 302, e.g. bather layer 302B, may include e.g. phosphorous acid (H3PO4) (85%) solution, if barrier layer 302B includes silicon dioxide ($Si_3N_4$). Another wet etchant may include e.g. hydrofluoric acid (HF) (1 to 10%) solution.

According to an embodiment, a dry etchant for etching layer arrangement 302, e.g. bather layer 302B, may include e.g. by mixture of CF4 carbonfluorine/oxygen $O_2$ plasma, if barrier layer 302B includes silicon nitride ($Si_3N_4$).

The two-step etch process may serve to remove any contaminants from the adhesion processes before subsequent processing steps, e.g. molding and wiring.

Chip 306 may be used as a hard mask by arranging chip 306 which may be chemically resistant to both etchant and/or etchants used in the two-step etch on layer arrangement 302. Layer 332 may be formed over second chip side 316, which may be a side of chip 306 exposed to the etchant. Layer 332 may include for example, a silicon dioxide ($SiO_2$) layer or a silicon nitride ($Si_3N_4$) layer or a polyimide (PI) layer. Layer 332 may be a layer which electrically insulates one or more contact pads 308 from each other. Layer 332 may have a thickness ranging from about 0.1 µm to about 10 µm, e.g. about 2 µm to about 8 µm.

During selective removal processes 330 to 340, one or more contact pads 308 may be opened e.g. exposed, or closed, e.g. covered during the etching of layer arrangement 302. In case of opened contact pads, layer 332 may be formed between one or more contact pads 308, and one or more contact pads 308 may be released, e.g. exposed, during etching. In case of closed contact pads, layer 332 may be formed between and over one or more contact pads 308, thereby covering the one or more contact pads 308.

In cases of open contact pads, it may be understood that according to various embodiments, one or more contact pads 308 may be formed from a material which is different from sacrificial layer 302S, e.g. if 302S includes silver layer, then one or more contact pads 308 may include copper. Furthermore, one or more contact pads 308 may be formed from a material different from bather layer 302B, e.g. if 302B includes Ti or TiW, then one or more contact pads 308 may not include Ti or TiW. According to various other embodiments, in cases of open contact pads, one or more contact pads 308 may be even be formed from the same material as sacrificial layer 302S, however, one or more contact pads 308 may have a larger thickness than sacrificial layer 302S. For example, one or more contact pads 308 may have a thickness ranging from about 0.8 µm to about 10 µm, in comparison to nanometer thicknesses of sacrificial layer 302S. This may mean that one or more contact pads 308, may be etched with an etchant used for sacrificial layer 302S, however, as a result of the larger thickness, one or more contact pads 308 are not fully etched away, and sufficient thickness of one or more contact pads 308 may be preserved after etching sacrificial layer 302S. This concept may alternatively be applied to barrier layer 302B. According to various other embodiments, in cases of open contact pads, one or more contact pads 308 may be formed from the same material as bather layer 302B, however, one or more contact pads 308 may have a larger thickness than sacrificial layer 302B. For example, one or more contact pads 308 may have a thickness ranging from about 0.8 µm to about 10 µm in comparison to nanometer thicknesses of barrier layer 302B.

It may be understood that one or more contact pads 308 may include noble metals, e.g. palladium, silver, platinum, gold, which may be generally chemically resistant to etchants. They may be selected such that they may also be resistant to subsequent carrier roughening processes.

Barrier layer 302B may prevent the diffusion of carrier material, e.g. material from carrier 304, e.g. copper particles, into adhesion material 312, e.g. silver layer, and/or backside metallization layer 318 and may furthermore prevent the diffusion of adhesion material 312, e.g. silver particles, into carrier 304. In other words, material from carrier 304, e.g. copper particles, may not be able to penetrate into adhesion material 312. The diffusion may be prevented as indicated by the crossed arrows as shown in FIG. 3E. It may be understood from FIGS. 1A and 1B, that chip packages, may be susceptible to unwanted diffusion. FIG. 1A shows a chip package, without layer arrangement 302, wherein chip 106 may have sustained damage, e.g. such as the cracking of backside metallization 118. Backside metallization 118 may be analogous to backside metallization 318, and may serve as a diffusion barrier, e.g. to diffusion between chip carrier 104 (analogous to chip carrier 304) into the chip 106, e.g. into silicon. As shown in FIG. 1B, cracking or damage of backside metallization 118, may cause leakage of carrier material, e.g. copper from carrier 104, through die attach material 112, into a silicon chip 106. Die attach material 112 (analogous to adhesion material 312) may conceivably also contribute to unwanted diffusion into chip 106, and into carrier 104. Therefore, barrier layer 302B may serve as an additional barrier layer, which may prevent the diffusion of carrier material, e.g. material from carrier 304, e.g. copper particles, through adhesion material 312, e.g. silver layer, and into chip 306, and furthermore, diffusion of adhesion material 312, e.g. silver particles, into carrier 304.

Roughening of the exposed upper surface portions 334 of carrier 304 may follow the selective removal of layer arrangement 302. Roughening one or more portions 334 of carrier 304 from which layer arrangement 302 has been selectively removed, i.e. from which one or more portions 322 of sacrificial layer 302S and one or more portions 324 of barrier layer 302B not covered by chip 306 have be selectively removed, may be carried out prior to depositing encapsulation material 336. Furthermore, adhesion promoters may be deposited, alternatively or in addition to roughening over one or more portions 334 of carrier 304. Adhesion promoters and/or roughening may improve adhesion between encapsulation material 336 and carrier 304. Specifically, adhesion promoters and/or roughening may improve adhesion between encapsulation material 336 and one or more portions 334 of carrier 304.

Method 300, as shown in FIG. 3F, process 360, and analogous process 560 (FIG. 5C), may include depositing encapsulation material 336 over chip 306 and carrier 304 to at least partially surround the chip. Encapsulation material 336 may include at least one material from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles. Encapsulation material 336 may be deposited by at least one deposition method from the following group of methods, the group consisting of: spin-coating, spraying, molding, compression molding, lamination. Encapsulation material 336 may be formed over, e.g. directly on layer 332, and furthermore, encapsulation material 336 may cover one or more contact pads 308 and one or more sidewalls of chip 306. Sidewalls may refer to sides of chip 306 between first chip side 314 and second chip side 316. Encapsulation material 336 may be formed over, e.g. directly on, carrier 304, such as one or more portions 334 of carrier 304, which may be roughened for improved adhesion, e.g. before deposition of encapsulation material 336.

One or more electrical interconnects 338 may be formed to electrically contact one or more contact pads 308 formed over chip 306. One or more electrical interconnects 338 may include at least one material, element or alloy from the following group of materials, the group consisting of: copper, aluminum, silver, tin, gold, palladium, zinc, nickel, iron.

According to various embodiments, one or more throughholes may be formed in encapsulation material 336, thereby releasing, e.g. exposing, one or more contact pads 308 from encapsulation material 336. One or more through-holes may be formed by drilling, e.g. laser drilling, e.g. using a $CO_2$ laser, to open up one or more contact pads 308. It may be understood that if one or more contact pads 308 were closed, (as previously described), for example, covered by layer 332 during the etching, then encapsulation material 336 may be formed over layer 332 thereby covering layer 332 and one or more contact pads 308. Laser drilling may then be used to drill through encapsulation material 336 and layer 332, e.g. a polyimide layer, to open one or more contact pads 308.

Once one or more contact pads 308 are open, i.e. exposed, i.e. released from layer 332 and encapsulation material 336, one or more electrical interconnects 338 may be formed by depositing electrically conductive material within the one or more through-holes, e.g. over one or more contact pads 308, thereby forming a physical and electrical connection to the one or more contact pads 308. Electrically conductive material may be deposited by at least one deposition method from the following group of methods, the group consisting of: electroplating, electroless plating, galvanic deposition, sputtering, evaporation. One or more electrical interconnects 338 may be electrically connected to, or may form at least part of one or more external chip-package contacts 342 formed over a side 344 of chip package 370. One or more external chip-package contacts 342, which may be further physically and electrically connected to solder structures, e.g. solder balls, e.g. solder bumps, e.g. solder arrays, may electrically connect chip 306, e.g. one or more contact pads 308 of chip 306, to an external electrical circuit, e.g. a further chip package, e.g. a printed circuit board, e.g. a power supply.

According to various embodiments, instead of forming one or more electrical interconnects 338 by deposition of electrically conductive material in through-holes, it may be possible that one or more electrical interconnects 338 may include electrically conductive wires bonded to one or more contact pads 308. The wires may be wire-bonded to one or more contact pads 308 and electrically connected for example, to one or more leads of a lead frame, before depositing encapsulation material 336. Encapsulation material 336 may then subsequently be deposited over chip 306 and carrier 304 as previously described and to at least partially the wires, e.g. the electrically insulate the wires from each other.

A chip package, e.g. chip package 370, may be manufactured according to method 300 as described. Chip package 370 may include layer arrangement 302 formed over carrier 304; chip 306 adhered to layer arrangement 302 via adhesion material 312, wherein layer arrangement 302 may include bather layer 302B formed over carrier 304 and sacrificial layer 302S formed over barrier layer 302B, wherein layer arrangement 302 may be undercut from sidewalls of chip 306; encapsulation material 336 formed over chip 306 and carrier 304, encapsulation material 336 at least partially surrounding chip 306; one or more electrical interconnects 338 formed through encapsulation material 336 and electrically contacting one or more contact pads 308 formed over chip 306. Chip package 370 may include one or more or all of the features already described with respect to other embodiments.

It may be understood that chip package 370 may be individualized, e.g. from other chips 306 also commonly formed over carrier 304, by separating through carrier 304, and encapsulation material 336.

Figure 4A:
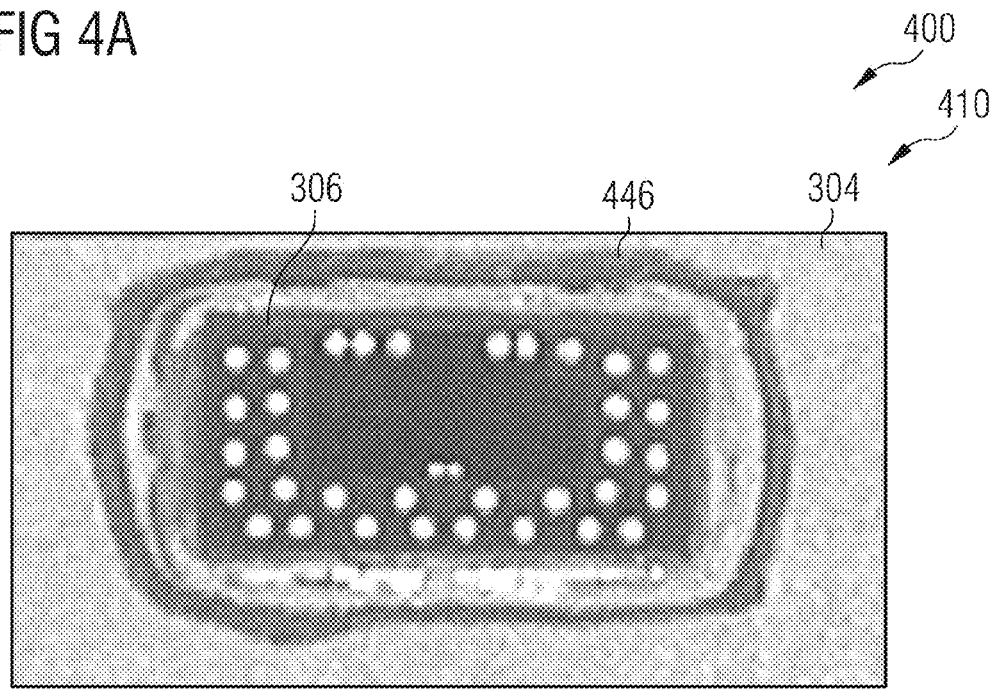
Figure 4B:
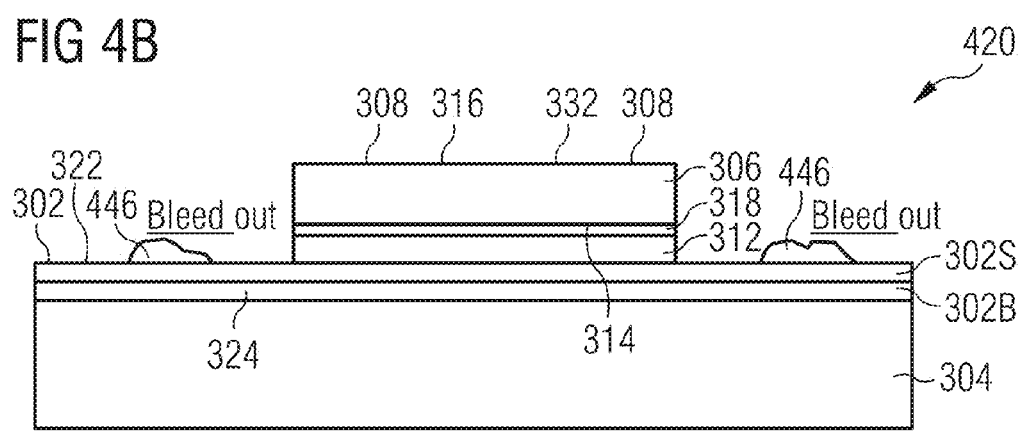

FIGS. 4A to 4C show method 400 for manufacturing a chip package according to an embodiment.

Method 400 may include one or more or all of the processes and features already described with respect to method 300.

In particular, FIG. 4A shows an image of chip 306 arranged over carrier 304, wherein "bleed out" deposits 446 may be formed over the carrier 304. These deposits are difficult to be removed, and may normally be subjected to aggressive and complicated cleaning processes which may damage the chip, as shown and described earlier in FIGS. 1A and 1B. Such additional cleaning processes may traditionally use alkalines, which may damage the chip. Method 300, 400 and 500 according to various embodiments, allow these deposits 446 to be cleanly removed without additional cleaning processes.

FIG. 4B, process 420, shows an embodiment, wherein adhesive material 312 may include paste 312, e.g. a nanopaste including silver, referred to as a silver nanopaste. Paste 312 may be cured, e.g. heated to a temperature of approximately 200° C., to adhere, e.g. to glue, e.g. to fix, chip 306 to layer arrangement 302 (analogous to process 320). Paste 312 may include particles, e.g. nanoparticles, such as silver particles, wherein such particles may be coated with organic molecules or solvents. "Bleed out" of these particles, in the form of deposits 446 may occur. "Bleed out", may refer to the deposition of these deposits 446, e.g. organic materials, out of paste 312 onto sacrificial layer 302S, e.g. onto the surface of sacrificial layer 302S. These may occur, for example, as a result of precipitation which may be due to heating. For example, "bleed out" deposits 446 may include precipitates of organic materials and/or silver particles, and/or decomposed materials such as organic materials and/or silver particles, from paste 312.

As shown in FIG. 4C, process 430, the two-step etch process, as described with respect to process 330, 340m, may etch away sacrificial layer 302S, e.g. one or more portions 322, and that material deposits 446 from "bleed out" and/or other contaminants may be well removed. For example, sacrificial layer 302S may be over-etched to ensure that materials from "bleed out" and/or other contaminants and/or precipitants over sacrificial layer 302S e.g. one or more portions 322 of sacrificial layer 302S, may be removed when sacrificial layer 302S is etched away; and further without removing bather layer 302B.

With the two-step etch process, a substantially perfectly clean surface, e.g. carrier surface, may be achieved, therefore avoiding stress and/or delamination from carrier 304 surface. Without a substantially clean carrier surface, subsequent roughening of carrier 304 (as earlier described) may not be able to be carried out well, and carrier 304 may not be sufficiently roughened for the adhesion of encapsulation material 336 over carrier 304. Furthermore, without a substantially clean carrier surface, adhesion promoters, may not be properly deposited well on carrier 304. As a result of a poor roughening process, and/or poor deposition of adhesion promoters, poor adhesion may ensue between encapsulation material and carrier and potential delamination from the carrier surface may occur. With the two-step etch process, damaging additional cleaning processes, may be avoided.

FIGS. 5A to 5C show method 500 for manufacturing a chip package, e.g. chip package 570, according to an embodiment. Method 500 may include one or more or all of the processes and features already described with respect to methods 300, 400, except that at least one of sacrificial layer 302S and barrier layer 302B may include an electrically insulating material.

According to various embodiments, as shown in FIG. 5A, an electrically insulator in the form of barrier layer 302B may be provided over carrier 304.

Barrier layer 302B may be electrically insulating, e.g. barrier layer 302 may include an electrically insulating material, e.g. silicon dioxide ($SiO_2$), e.g. silicon nitride ($Si_3N_4$). Silicon dioxide and silicon nitride may be deposited by chemical vapor deposition. Barrier layer 302B may have a thickness ranging from about 50 nm to about 1000 nm, e.g. about 50 nm to about 200 nm, e.g. about 50 nm to about 100 nm. Electrically conductive sacrificial layer 302S as previously described may be formed over electrically insulating barrier layer 302B. Chip 306 may be arranged over layer arrangement 302, thereby adhering chip 306 to layer arrangement 302 via adhesion material 312. Adhesion material 312 may be electrically conducting or electrically insulating as described above.

According to an embodiment, chip 306 may include an insulated gate bipolar transistor (IGBT), and adhesion material 312 may include an electrically conductive material, sacrificial layer 302S may be electrically conductive, e.g. Ag layer, and barrier layer 302B may be electrically insulating, e.g. silicon oxide, e.g. silicon nitride.

According to another embodiment, chip 306 may, for example, include low power semiconductor chips, e.g. semiconductor logic chips. Backside metallization layer 318 may be omitted and at least one layer 302S, 302B of layer arrangement 302 and adhesion material 312 may include an electrically insulating material.

According to various other embodiments, sacrificial layer 302S may even be omitted optionally if necessary. Adhesion material 312 may then be adhered, e.g. fixed, directly to barrier layer 302B if sacrificial layer 302S is omitted.

As previously described, depending on the requirements of the chip package to be manufactured, electrical connectivity or electrical insulation may be required between first chip side 314 and carrier 304. These requirements, may play a role in materials selection, e.g. of backside metallization layer 318, e.g. of adhesion layer 312, e.g. of layers 302B, 302S of layer arrangement 302. Further considerations with regard to materials selection, may include the consideration of chip substrate material, and layer 332, which may be selected to be chemically resistant to etchants used for etching of layers 302B, 302S of layer arrangement 302.

According to various embodiments, if an electrical connection may be required between first chip side 314 and carrier 304, then, arranging chip 306 including one or more contact pads 308, 318 over layer arrangement 302 may include soldering chip 306 to layer arrangement 302 via solder material 312 formed over contact pad 318 formed over a first chip side. For example, adhesion layer 312 may include a solder material. Solder material 312 may be electrically conductive, and may include at least one material from the following group of materials, the group of materials consisting of: Ag, Pb, Zn, Sn, Au, Sb, Bi, In, Ga, Ni or one or more combinations of these materials. For example, a AuSn diffusion solder may be used by applying the Au and Sn layers on top of the chip backside metallization layers and placing the chip on the carrier substrate and fixing it at temperatures of about 350° C.

According to various embodiments, if an electrical connection may be required between first chip side 314 and carrier 304, then, arranging chip 306 including one or more contact pads 308, 318 over layer arrangement 302 may include adhering chip 306 to layer arrangement 302 via electrically conductive adhesion material 312, such as an electrically conductive adhesive glue and/or an electrically conductive resin and/or an electrically conductive adhesive polymer and/or an electrically conductive paste and/or an electrically conductive adhesive paste and/or an electrically conductive epoxy filled or unfilled with nanoparticles (e.g. electrically conductive nanoparticles), and/or an electrically conductive adhesive tape or foil. Such nanoparticles may include nanoparticles of copper and/or silver and/or gold. The electrically conductive adhesion material 312 may include a liquid or paste or tape before being attached to the chip backside According to various embodiments, if an electrical connection may be required between first chip side 314 and carrier 304, then, arranging chip 306 including one or more contact pads 308, 318 over layer arrangement 302 may include adhering chip 306 to layer arrangement 302 via paste 312 formed over contact pad 318 formed over first chip side 314, wherein the paste may include a nanopaste including silver. For example, adhesion layer 312 may include a paste 312. The paste may be cured to adhere chip 306 to layer arrangement 302.

According to various embodiments, if an electrical connection may not be required between first chip side 314 and carrier 304, i.e. electrical insulation may be required, then, arranging chip 306 including one or more contact pads 308, 318 over layer arrangement 302 may include adhering chip 306 to layer arrangement 302 via electrically insulating adhesion material 312. For example, adhesion layer 312 may include electrically insulating adhesion material 312. Electrically insulating adhesion material 312 may include an electrically insulating adhesive glue and/or an electrically insulating resin and/or an electrically insulating adhesive polymer and/or an electrically insulating paste and/or an electrically insulating epoxy filled or unfilled, and/or an electrically insulating adhesive tape or foil.

It may be understood that materials selection (e.g. of backside metallization layer 318, e.g. of adhesion layer 312, e.g. of layers 302B, 302S of layer arrangement 302, chip substrate material, and layer 332) may also be carried out in view of etchants. For example, etchant and material selection may be carried out such that chip 306, including layer 332 may be chemically resistant to an etchant used for the etching of at least one of sacrificial layer 302S and barrier layer 302B. For example, if barrier layer 302B comprises SiO2, the etchant may include hydrofluoric acid, layer 332 may include at least one of polyimide or parylene or diamond like carbon (DLC). If sacrificial layer includes silver, the etchant may include hydrofluoric acid (HF) or nitric acid (HNO3); if barrier layer 302B may include TiW it may be etched by at least one of ammonia (NH3), hydrogen peroxide (H2O2) and water (H2O). Layer 332 may include at least one of polyimide or parylene or diamond like carbon (DLC).

Various embodiments provide a method for manufacturing a chip package, the method including: forming a layer arrangement over a carrier; arranging a chip including one or more contact pads over the layer arrangement wherein the chip covers at least part of the layer arrangement; and selectively removing one or more portions of the layer arrangement and using the chip as a mask such that at least part of the layer arrangement covered by the chip is not removed.

According to an embodiment, forming a layer arrangement over the carrier includes depositing a barrier layer over the carrier; and depositing a sacrificial layer over the barrier layer.

According to an embodiment, the barrier layer includes at least one material from the following group of materials, the group of materials consisting of: Ti, TiW, silicon nitride, silicon oxide, silicon dioxide.

According to an embodiment, the sacrificial layer includes at least one material from the following group of materials, the group of materials consisting of: Cu, Ag Sn, Zn, Pb, Bi, Sb, Ni, Au or alloys including one of these elements.

According to an embodiment, the barrier layer includes a thickness ranging from about 30 nm to about 300 nm.

According to an embodiment, the sacrificial layer includes a thickness ranging from about 50 nm to about 400 nm.

According to an embodiment, depositing a barrier layer over the carrier includes depositing the barrier layer by at least one method from the following group of methods, the group consisting of: chemical vapor deposition, sputtering, evaporation of metals, physical vapor deposition or printing.

According to an embodiment, depositing a sacrificial layer over the barrier layer includes depositing the sacrificial layer by at least one method from the following group of methods, the group consisting of: sputtering, chemical vapor deposition, evaporation of metals, physical vapor deposition or printing.

According to an embodiment, forming a layer arrangement over a carrier includes forming a layer arrangement over a carrier, the carrier including an electrically conductive leadframe.

According to an embodiment, arranging a chip including one or more contact pads over the layer arrangement includes adhering the chip to the layer arrangement via an adhesion material formed over a first chip side.

According to an embodiment, the adhesion material includes at least one material from the following group of materials, the group of materials consisting of: a solder, an adhesive glue, a resin, an adhesive polymer, a paste, and adhesive paste, an epoxy filled or unfilled with nanoparticles, adhesive tape or foil.

According to an embodiment, arranging a chip including one or more contact pads over the layer arrangement includes soldering the chip to the layer arrangement via a solder material formed over a contact pad formed over a first chip side.

According to an embodiment, the solder material includes at least one material from the following group of materials, the group of materials consisting of: Ag, Pb, Zn, Sn, Au, Sb, Bi, In, Ga, Ni or one or more combinations of these materials.

According to an embodiment, arranging a chip including one or more contact pads over the layer arrangement includes adhering the chip to the layer arrangement via a paste formed over a contact pad formed over a first chip side, wherein the paste includes a nanopaste including silver.

According to an embodiment, the method further includes curing the paste to adhere the chip to the layer arrangement.

According to an embodiment, selectively removing one or more portions of the layer arrangement and using the chip as a mask such that at least part of the layer arrangement covered by the chip is not removed includes selectively removing with an etchant one or more portions of the layer arrangement not covered by the chip, and using the chip as a hard mask which is resistant to removal by the etchant.

According to an embodiment, selectively removing one or more portions of the layer arrangement and using the chip as a mask such that at least part of the layer arrangement covered by the chip is not removed includes selectively removing with an etchant one or more portions of the sacrificial layer not covered by the chip, wherein the barrier layer is resistant to removal by the etchant.

According to an embodiment, the barrier layer is an etch stop layer for the selective removal of the sacrificial layer.

According to an embodiment, selectively removing one or more portions of the layer arrangement and using the chip as a mask such that at least part of the layer arrangement covered by the chip is not removed includes over-etching the sacrificial layer, wherein the barrier layer is resistant to the etching of the sacrificial layer.

According to an embodiment, selectively removing one or more portions of the layer arrangement and using the chip as a mask such that at least part of the layer arrangement covered by the chip is not removed includes selectively removing one or more portions of the sacrificial layer not covered by the chip and subsequently selectively removing one or more portions of the bather layer not covered by the chip.

According to an embodiment, the method further includes depositing an encapsulation material over the chip and the carrier to at least partially surround the chip.

According to an embodiment, the method further includes roughening one or more portions of the carrier from which the layer arrangement has been selectively removed prior to depositing the encapsulation material, to improve adhesion between the encapsulation material and the carrier.

According to an embodiment, the encapsulation material includes at least one material from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

According to an embodiment, the method further includes forming one or more electrical interconnects to electrically contact one or more contact pads formed over the chip.

Various embodiments provide a chip package including a layer arrangement formed over a carrier; a chip adhered to the layer arrangement via an adhesion material, wherein the layer arrangement includes a bather layer formed over the carrier and a sacrificial layer formed over the bather layer, wherein the layer arrangement is undercut from sidewalls of the chip; an encapsulation material formed over the chip and the carrier, the encapsulation material at least partially surrounding the chip; one or more electrical interconnects formed through the encapsulation material and electrically contacting one or more contact pads formed over the chip.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip package, the method comprising:
   forming a layer arrangement over a carrier;
   arranging a chip comprising one or more contact pads over the layer arrangement wherein the chip covers at least part of the layer arrangement; and
   selectively removing one or more portions of the layer arrangement and using the chip as a mask such that at least part of the layer arrangement covered by the chip is not removed,
   wherein forming a layer arrangement over the carrier comprises depositing a barrier layer over the carrier and depositing a sacrificial layer over the barrier layer.

2. The method according to claim 1,
   wherein the barrier layer comprises at least one material from the following group of materials, the group of materials consisting of: Ti, TiW, silicon nitride, silicon oxide, silicon dioxide.

3. The method according to claim 1,
   wherein the sacrificial layer comprises at least one material from the following group of materials, the group of materials consisting of: Cu, Ag, Sn, Zn, Pb, Bi, Sb, Ni, Au or alloys including one of these elements.

4. The method according to claim 1,
   wherein the barrier layer comprises a thickness ranging from about 30 nm to about 300 nm.

5. The method according to claim 1,
   wherein the sacrificial layer comprises a thickness ranging from about 50 nm to about 400 nm.

6. The method according to claim 1,
   wherein depositing a barrier layer over the carrier comprises depositing the barrier layer by at least one method from the following group of methods, the group consisting of: chemical vapor deposition, sputtering, evaporation of metals, physical vapor deposition or printing.

7. The method according to claim 1,
   wherein depositing a sacrificial layer over the barrier layer comprises depositing the sacrificial layer by at least one method from the following group of methods, the group consisting of: sputtering, chemical vapor deposition, evaporation of metals, physical vapor deposition or printing.

8. The method according to claim 1,
   wherein forming a layer arrangement over a carrier comprises
   forming a layer arrangement over a carrier, the carrier comprising an electrically conductive leadframe.

9. The method according to claim 1,
   wherein arranging a chip comprising one or more contact pads over the layer arrangement comprises
   adhering the chip to the layer arrangement via an adhesion material formed over a first chip side.

10. The method according to claim 9,
    wherein the adhesion material comprises at least one material from the following group of materials, the group of materials consisting of: a solder, an adhesive glue, a resin, an adhesive polymer, a paste, and adhesive paste, an epoxy filled or unfilled with nanoparticles, adhesive tape or foil.

11. The method according to claim 1,
    wherein arranging a chip comprising one or more contact pads over the layer arrangement comprises soldering the chip to the layer arrangement via a solder material formed over a contact pad formed over a first chip side.

12. The method according to claim 11,
    wherein the solder material comprises at least one material from the following group of materials, the group of materials consisting of: Ag, Pb, Zn, Sn or one or more combinations of these materials.

13. The method according to claim 1,
    wherein arranging a chip comprising one or more contact pads over the layer arrangement comprises adhering the chip to the layer arrangement via a paste formed over a contact pad formed over a first chip side, wherein the paste comprises a nanopaste comprising silver.

14. The method according to claim 13,
    further comprising curing the paste to adhere the chip to the layer arrangement.

15. The method according to claim 1, wherein
    selectively removing one or more portions of the layer arrangement and using the chip as a mask such that at least part of the layer arrangement covered by the chip is not removed comprises
    selectively removing with an etchant one or more portions of the layer arrangement not covered by the chip, and using the chip as a hard mask which is resistant to removal by the etchant.

16. The method according to claim 1, wherein
    selectively removing one or more portions of the layer arrangement and using the chip as a mask such that at least part of the layer arrangement covered by the chip is not removed comprises
    selectively removing with an etchant one or more portions of the sacrificial layer not covered by the chip, wherein the barrier layer is resistant to removal by the etchant.

17. The method according to claim 16, wherein
    wherein the barrier layer is an etch stop layer for the selective removal of the sacrificial layer.

18. The method according to claim 1, wherein
    selectively removing one or more portions of the layer arrangement and using the chip as a mask such that at least part of the layer arrangement covered by the chip is not removed comprises
    over-etching the sacrificial layer, wherein the barrier layer is resistant to the etching of the sacrificial layer.

19. The method according to claim 1, wherein
    selectively removing one or more portions of the layer arrangement and using the chip as a mask such that at least part of the layer arrangement covered by the chip is not removed comprises
    selectively removing one or more portions of the sacrificial layer not covered by the chip and subsequently selectively removing one or more portions of the barrier layer not covered by the chip.

20. The method according to claim 1, further comprising
    depositing an encapsulation material over the chip and the carrier to at least partially surround the chip.

21. The method according to claim 20, further comprising
    roughening one or more portions of the carrier from which the layer arrangement has been selectively removed prior to depositing the encapsulation material, to improve adhesion between the encapsulation material and the carrier.

22. The method according to claim 20,
wherein the encapsulation material comprises at least one material from the following group of materials, the group consisting of: filled or unfilled epoxy, pre-impregnated composite fibers, reinforced fibers, laminate, a mold material, a thermoset material, a thermoplastic material, filler particles, fiber-reinforced laminate, fiber-reinforced polymer laminate, fiber-reinforced polymer laminate with filler particles.

23. The method according to claim 20, further comprising forming one or more electrical interconnects to electrically contact one or more contact pads formed over the chip.

24. A method for manufacturing a chip package, the method comprising:
 forming a layer arrangement over a carrier;
 arranging a chip comprising one or more contact pads over the layer arrangement wherein the chip covers at least part of the layer arrangement; and
 selectively removing one or more portions of the layer arrangement and using the chip as a mask such that at least part of the layer arrangement covered by the chip is not removed,
 wherein arranging a chip comprising one or more contact pads over the layer arrangement comprises adhering the chip to the layer arrangement via an adhesion material formed over a chip first side.

25. A method for manufacturing a chip package, the method comprising:
 forming a layer arrangement over a carrier;
 arranging a chip comprising one or more contact pads over the layer arrangement wherein the chip covers at least part of the layer arrangement; and
 selectively removing one or more portions of the layer arrangement and using the chip as a mask such that at least part of the layer arrangement covered by the chip is not removed,
 wherein selectively removing one or more portions of the layer arrangement and using the chip as a mask such that at least part of the layer arrangement covered by the chip is not removed comprises selectively removing with an etchant one or more portions of the layer arrangement not covered by the chip, and using the chip as a hard mask which is resistant to removal by the etchant.

* * * * *